United States Patent
Lai et al.

(10) Patent No.: US 11,456,177 B2
(45) Date of Patent: Sep. 27, 2022

(54) METHOD OF MANUFACTURING SEMICONDUCTOR DEVICE

(71) Applicant: NANYA TECHNOLOGY CORPORATION, New Taipei (TW)

(72) Inventors: Jen-I Lai, Taoyuan (TW); Chun-Heng Wu, Taoyuan (TW); Rou-Wei Wang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 148 days.

(21) Appl. No.: 17/029,023

(22) Filed: Sep. 22, 2020

(65) Prior Publication Data

US 2022/0093402 A1 Mar. 24, 2022

(51) Int. Cl.
| | |
|---|---|
| *H01L 21/3205* | (2006.01) |
| *H01L 21/28* | (2006.01) |
| *H01L 29/40* | (2006.01) |
| *H01L 21/033* | (2006.01) |
| *H01L 29/423* | (2006.01) |

(52) U.S. Cl.
CPC .... *H01L 21/28114* (2013.01); *H01L 21/0334* (2013.01); *H01L 21/28088* (2013.01); *H01L 29/401* (2013.01); *H01L 29/4236* (2013.01)

(58) Field of Classification Search
CPC .......... H01L 21/28114; H01L 21/0334; H01L 21/28088; H01L 29/401; H01L 29/4236
See application file for complete search history.

(56) References Cited

U.S. PATENT DOCUMENTS

| | | | |
|---|---|---|---|
| 6,461,529 B1 * | 10/2002 | Boyd | ................ H01L 29/66583 438/743 |
| 2004/0173839 A1 * | 9/2004 | Casarotto | .............. H01L 27/115 257/E21.422 |

(Continued)

FOREIGN PATENT DOCUMENTS

| | | |
|---|---|---|
| CN | 1471144 A | 1/2004 |
| CN | 1926692 A | 3/2007 |

(Continued)

*Primary Examiner* — Victor A Mandala
*Assistant Examiner* — Colleen E Snow
(74) *Attorney, Agent, or Firm* — CKC & Partners Co., LLC

(57) ABSTRACT

A method of manufacturing a semiconductor device is provided. A precursor structure is formed, in which the precursor structure includes a patterned substrate having at least one trench therein, an oxide layer covering the patterned substrate, and a nitride layer on the oxide layer and exposing a portion of the oxide layer in the trench. A first barrier layer and a first gate structure is formed on the oxide layer. A portion of the first barrier layer is removed with an etchant including $CF_4$, $C_2F_6$, $C_3F_8$, $C_4F_8$, $F_2$, $NF_3$, $SF_6$, $CHF_3$, HF, $COF_2$, $ClF_3$ or $H_2O_2$ to expose a sidewall of the oxide layer. A second barrier layer is formed on the first gate structure and the oxide layer. A portion of the second barrier layer is removed with the etchant. A second gate structure is formed on the second barrier layer.

9 Claims, 15 Drawing Sheets

200

(56) References Cited

U.S. PATENT DOCUMENTS

| | | | |
|---|---|---|---|
| 2008/0073697 A1* | 3/2008 | Aoki | H01L 29/42336 |
| | | | 257/E21.546 |
| 2016/0172488 A1* | 6/2016 | Oh | H01L 27/228 |
| | | | 257/330 |
| 2018/0269380 A1* | 9/2018 | Li | H01L 28/24 |
| 2020/0091303 A1 | 3/2020 | Nam | |

FOREIGN PATENT DOCUMENTS

| | | |
|---|---|---|
| TW | 550711 B | 9/2003 |
| TW | 561513 B | 11/2003 |
| TW | I255506 B | 5/2006 |
| TW | 201021099 A | 6/2010 |
| TW | 201926686 A | 7/2019 |

* cited by examiner

METHOD OF MANUFACTURING SEMICONDUCTOR DEVICE

BACKGROUND

Field of Invention

The present invention relates to a method of manufacturing a semiconductor device. More particularly, the present invention relates to a method of manufacturing a semiconductor device having a buried gate structure.

Description of Related Art

A DRAM device may include a plurality of buried-channel array transistor (BCAT). The buried-channel array transistor has a longer effective channel length compared with a planar transistor as its gate electrode is buried under a semiconductor substrate, such that the DRAM device may be downsized and the integration density thereof can be increased.

However, an issue in that gate induced drain leakage (GIDL) is increased. Because the buried-channel array transistor has a larger area where a gate electrode overlaps with impurity regions (e.g., source/drain regions), it is difficult to decrease the gate induced drain leakage (GIDL). The increased GIDL is not desired because it reduces the reliability of the transistor.

SUMMARY

In accordance with an aspect of the present disclosure, a method of manufacturing a semiconductor device is provided. The method includes forming a precursor structure. The precursor structure includes a patterned substrate having at least one trench therein, an oxide layer covering the patterned substrate, and a nitride layer on the oxide layer and exposing a portion of the oxide layer in the trench. A first barrier layer is then formed on the oxide layer. A first gate structure is formed on the first barrier layer. A portion of the first barrier layer is removed with an etchant including $CF_4$, $C_2F_6$, $C_3F_8$, $C_4F_8$, $F_2$, $NF_3$, $SF_6$, $CHF_3$, $HF$, $COF_2$, $ClF_3$ or $H_2O_2$ to expose a sidewall of the oxide layer. A second barrier layer is formed on the first gate structure and the oxide layer. A portion of the second barrier layer is removed with the etchant including $CF_4$, $C_2F_6$, $C_3F_8$, $C_4F_8$, $F_2$, $NF_3$, $SF_6$, $CHF_3$, $HF$, $COF_2$, $ClF_3$ or $H_2O_2$. A second gate structure is formed on the second barrier layer.

According to some embodiments of the present disclosure, forming the precursor structure includes following operations. An oxide material layer is formed on a top surface of a substrate. A nitride material layer is formed on the oxide material layer. A mask layer is formed on the nitride material layer, in which the mask layer has at least one opening exposing a portion of the nitride material layer. The nitride material layer, the oxide material layer and the substrate are etched through the mask layer to form the patterned substrate. The oxide layer is formed to cover the trench.

According to some embodiments of the present disclosure, the first gate structure is treated with a protectant including $H_2$, $NH_3$, $C_xH_y$ and a combination thereof before removing the portion of the first barrier layer, in which x is 1-4 and y is 4-8.

According to some embodiments of the present disclosure, after removing the portion of the second barrier layer, the remaining second barrier layer on the first gate structure has a thickness of about 2-4 nm.

According to some embodiments of the present disclosure, the first barrier layer and the second barrier layer collectively wrap the first gate structure.

According to some embodiments of the present disclosure, the second gate structure has a thickness of about 10-30 nm.

According to some embodiments of the present disclosure, forming the second gate structure further includes forming a second gate material on the second barrier layer; doping the second gate material with phosphorous; and etching the second gate material to form the second gate structure in the trench.

According to some embodiments of the present disclosure, the first barrier layer and the second barrier layer includes titanium nitride.

According to some embodiments of the present disclosure, the method further includes forming a first source/drain region and a second source/drain region in the patterned substrate, in which the first source/drain region and the second source/drain region are on opposite sides of the trench.

According to some embodiments of the present disclosure, the method further includes forming a first contact and a second contact respectively connected to the first source/drain region and the second source/drain region.

It is to be understood that both the foregoing general description and the following detailed description are by examples, and are intended to provide further explanation of the disclosure as claimed.

BRIEF DESCRIPTION OF THE DRAWINGS

The following embodiments are disclosed with accompanying diagrams for detailed description. It is emphasized that, in accordance with the standard practice in the industry, various features are not drawn to scale and are used for illustration purposes only. In fact, the dimensions of the various features may be arbitrarily increased or reduced for clarity of discussion. Like reference numerals denote like features throughout specification and drawings.

For illustration clarity, many details of practice are explained in the following descriptions. However, it should be understood that these details of practice do not intend to limit the present invention. That is, these details of practice are not necessary in parts of embodiments of the present invention. Furthermore, for simplifying the drawings, some of the conventional structures and elements are shown with schematic illustrations.

The invention can be more fully understood by reading the following detailed description of the embodiment, with reference made to the accompanying drawings as follows.

Figure 1:
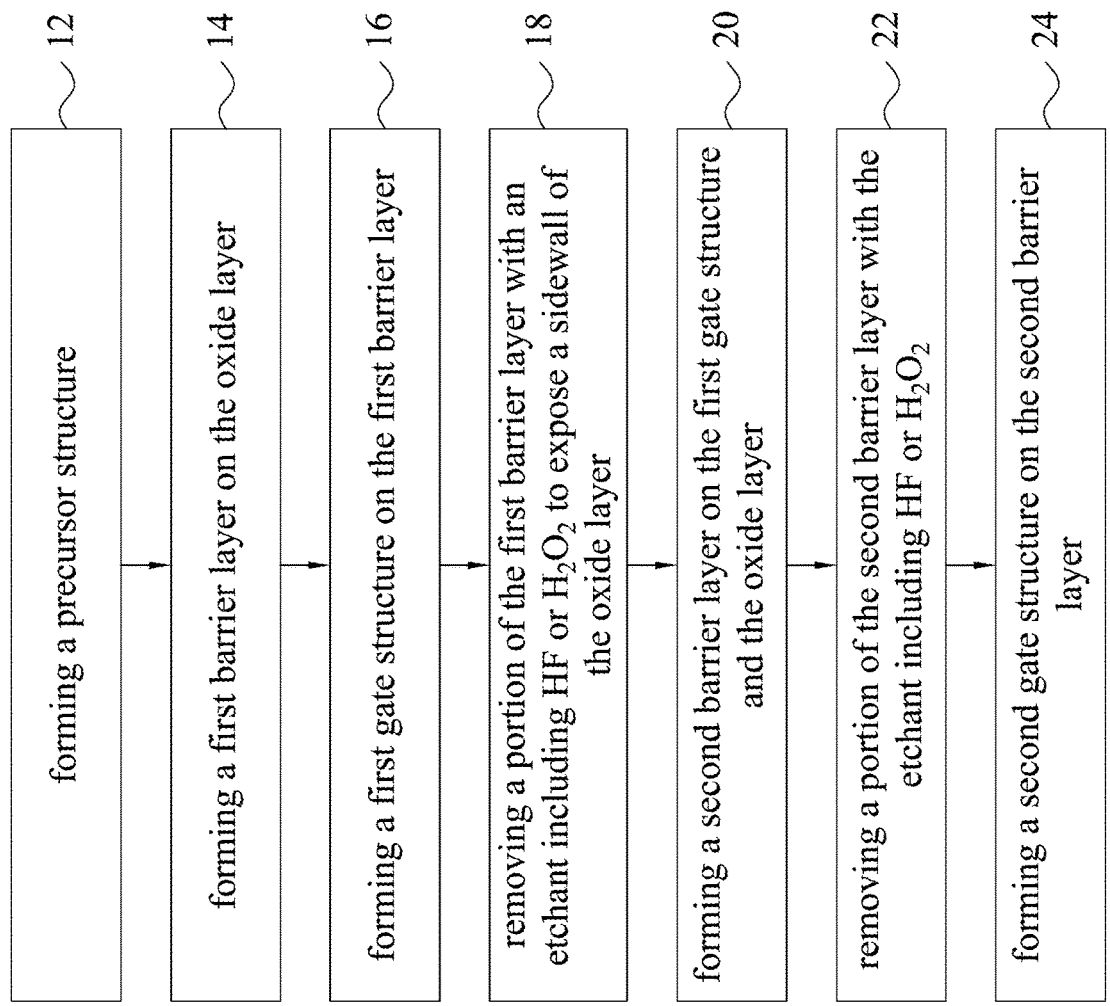

FIG. 1 is a flow chart illustrating a method of manufacturing a semiconductor device in accordance with some embodiments of this disclosure.

FIG. 2 to FIG. 15 are cross-sectional views of various intermediary stages in the manufacturing of semiconductor device in accordance with some embodiments of this disclosure.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Specific embodiments of the components and arrangements described below are intended to simplify the present disclosure. Of course, these are merely embodiments and are not intended to limit the present disclosure. For example, forming a first feature above or on a second feature in the subsequent description may include an embodiment in which the first feature and the second feature are formed as in direct contact, or include an embodiment in which an additional feature is formed between the first feature and the second feature such that the first feature and the second feature are not in direct contact. Additionally, component symbols and/or letters may be repeated in various embodiments of the present disclosure. This repetition is for the purpose of simplicity and clarity, and does not in itself indicate the relationship between the various embodiments and/or configurations discussed.

Furthermore, spatial relative terms, such as "below", "under", "above", "over", etc., are intended to facilitate description of the relative relationship between a component or feature and another component or feature, as shown in the drawings. The true meaning of these spatial relative terms includes other orientations. For example, when the illustration is flipped up and down by 180 degrees, the relationship between a component and another component may change from "below" or "under" to "above" or "over". Furthermore, the spatial relative narratives used herein should be interpreted the same.

FIG. 1 is a flow chart illustrating a method of manufacturing a semiconductor device in accordance with some embodiments of this disclosure. The method 10 includes operations 12, 14, 16, 18, 20, 22 and 24. It is noted that the method depicted in FIG. 1 is merely an example, and is not intended to limit the present invention. Accordingly, additional operations may be performed before, during, and/or after the method depicted in FIG. 1, and some other operations may only be briefly described herein. FIGS. 2-15 are cross-sectional views at various stages of method 10 according to some embodiments of the present disclosure.

Figure 5:
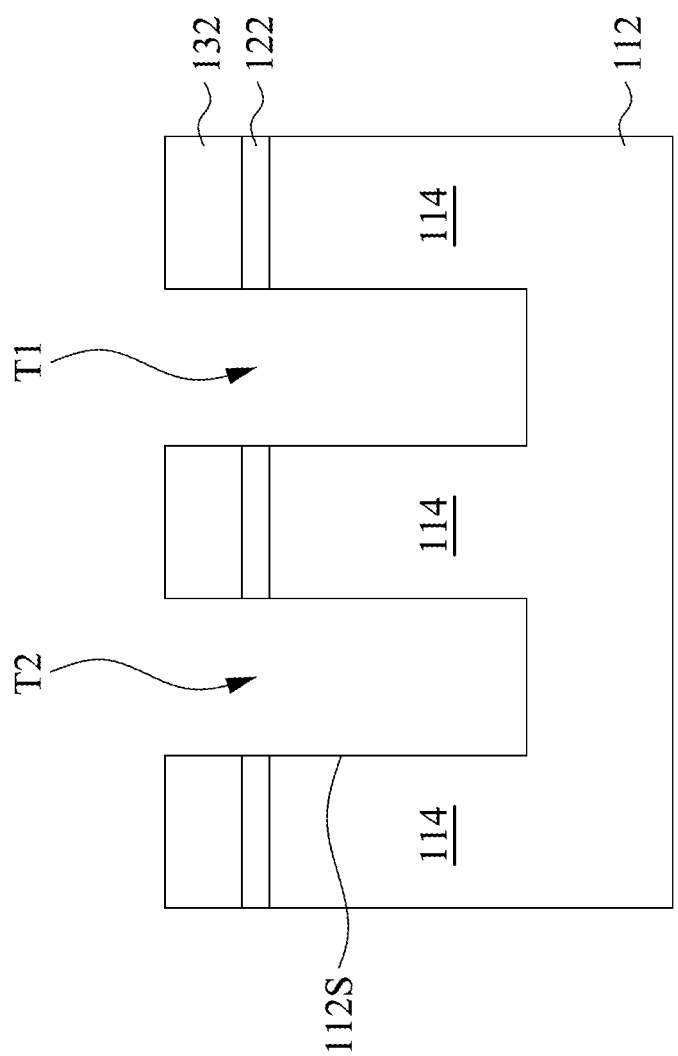
Figure 6:
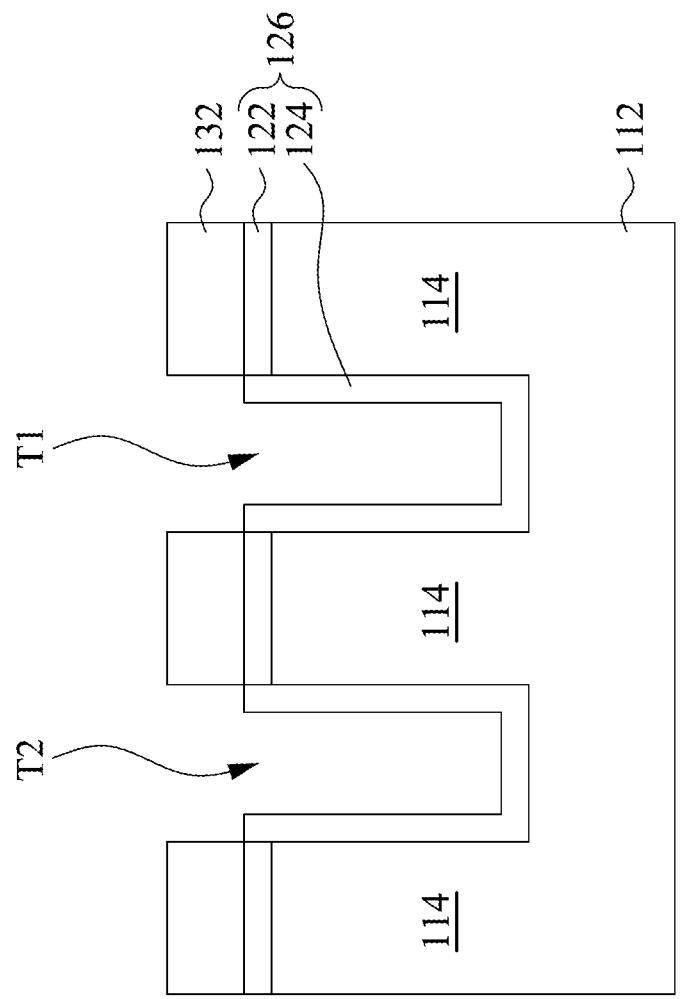

Reference is made to FIG. 1 and FIG. 6. In the operation 12 of FIG. 1, a precursor structure 100 is formed. The precursor structure 100 includes a patterned substrate 112, an oxide layer 126 and a nitride layer 132. FIGS. 2-6 illustrate the detail steps of implementing operation 12 in accordance with an embodiment of the present disclosure.

Figure 2:
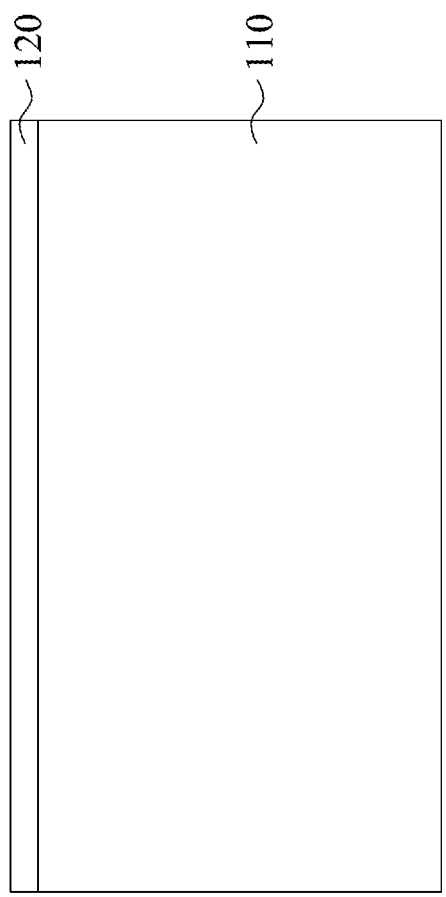

Referring to FIG. 2, an oxide material layer 120 is formed on a top surface of a substrate 110. In some embodiments, the substrate 110 may be, for example, a silicon substrate, a gallium arsenide substrate, a silicon germanium substrate, or the like. In some embodiments of the present invention, the substrate 110 may be a silicon substrate on insulator (SOI) substrate. In some embodiments, the substrate 110 may further include at least one shallow trench isolation (STI) region formed therein. In one example, the shallow trench isolation (STI) region may include silicon oxide, silicon nitride and/or silicon oxynitride. In some embodiments, the oxide material layer 120 includes silicon oxide, but is not limited thereto. In some embodiments, the oxide material layer 120 is formed on the substrate 110 by suitable method such as thermal oxidation, or chemical vapor deposition (CVD), but is not limited thereto.

Figure 3:
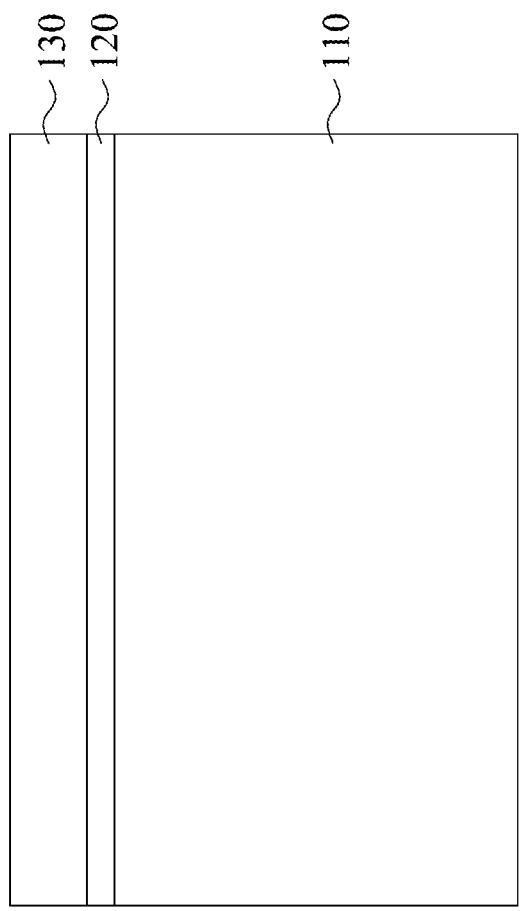

Next, referring to FIG. 3, a nitride material layer 130 is formed on the oxide material layer 120. In some embodiments, the nitride material layer 130 includes silicon nitride, but is not limited thereto. The nitride material layer 130 may be formed on the oxide material layer 120 by suitable deposition method such as CVD, low pressure CVD (LPCVD), plasma enhanced CVD (PECVD), or the like.

Figure 4:
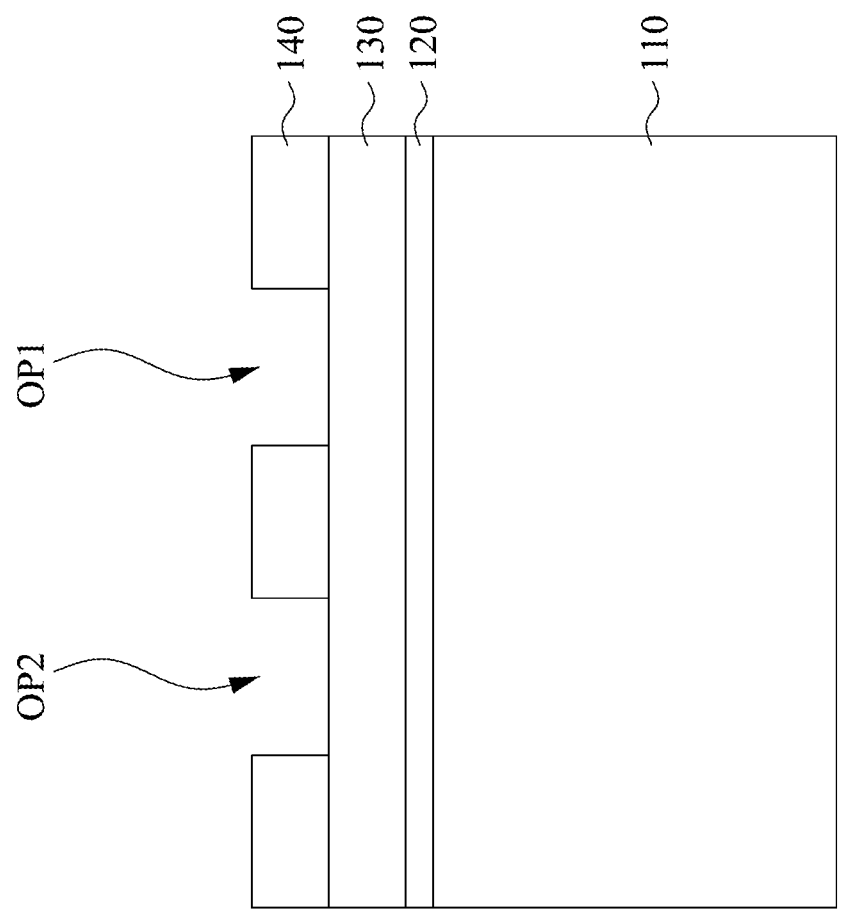

Referring to FIG. 4, a mask layer 140 is then formed on the nitride material layer 130. As shown in FIG. 4, the mask layer 140 has at least one opening (e.g., a first opening OP1 and a second opening OP2) exposing a portion of the nitride material layer 130. In some embodiments, the mask layer 140 may be photoresist.

Referring to FIG. 5, the nitride material layer 130, the oxide material layer 120 and the substrate 110 are etched through the first opening OP1 and the second opening OP2 of the mask layer 140 to form a nitride layer 132, an oxide layer 122 and the patterned substrate 112. The patterned substrate 112 may be formed by dry etching process. After the etching process, the mask layer 140 is removed. As shown in FIG. 5, the patterned substrate 112 has at least one trench, for example, a first trench T1 and a second trench T2 therein. The first trench T1 and the second trench T2 have an inner surface 112S. The first trench T1 and the second trench T2 are separated from each other by a protruding portion 114 of the patterned substrate 112. The first trench T1 and the second trench T2 may have various shapes, such as a square shape, a rectangular shape, a trapezoid shape, a cylinder shape, a tube shape, and the like, but it is not limited thereto. The oxide layer 122 and the nitride layer 132 are formed on protruding portions 114 of the patterned substrate 112.

Referring to FIG. 6, an oxide layer 124 is formed to cover the first trench T1 and the second trench T2. As such, the precursor structure 100 is formed. In some embodiments, the oxide layer 124 may be formed by thermal oxidization of the patterned substrate 112. The oxide layer 124 is formed on the inner surface 112S (shown in FIG. 5) of the first trench T1 and the second trench T2. In some embodiments, the oxide layer 124 includes silicon oxide, but is not limited thereto. In some examples, the material of the oxide layer 124 is substantially the same as that of the oxide layer 122. The oxide layer 122 and the oxide layer 124 collectively form the oxide layer 126 which conformally covers the patterned substrate 112. The nitride layer 132 exposes the oxide layer 124 in the first trench T1 and the second trench T2.

Figure 7:
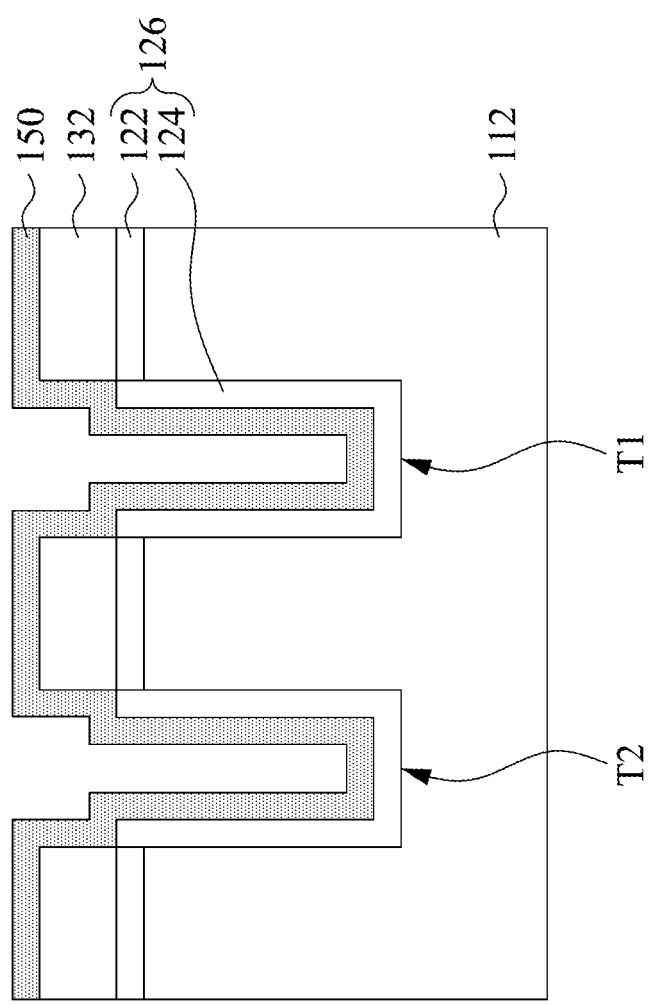

Reference is made to FIG. 1 and FIG. 7. In the operation 14 of FIG. 1, a first barrier layer 150 is formed on the nitride layer 132 and the oxide layer 126. In some embodiments, the first barrier layer 150 includes titanium nitride, but is not limited thereto. The first barrier layer 150 may be conformally formed on the nitride layer 132 and the oxide layer 126 by suitable method such as CVD, LPCVD, PECVD, or the like.

Figure 8:
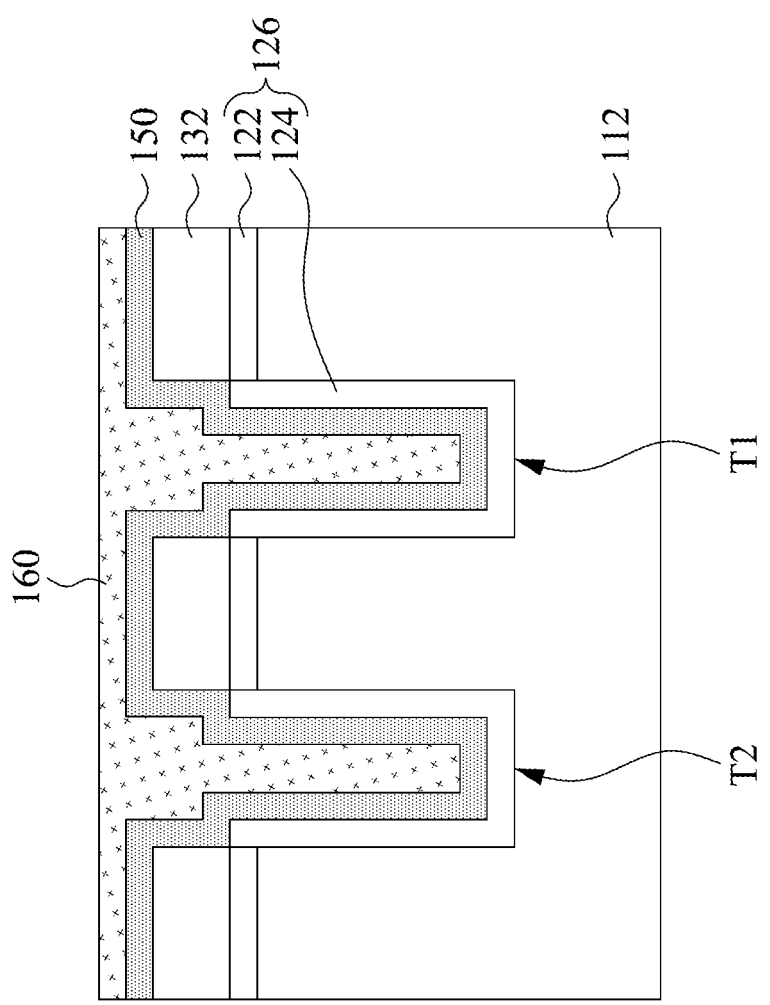
Figure 9:
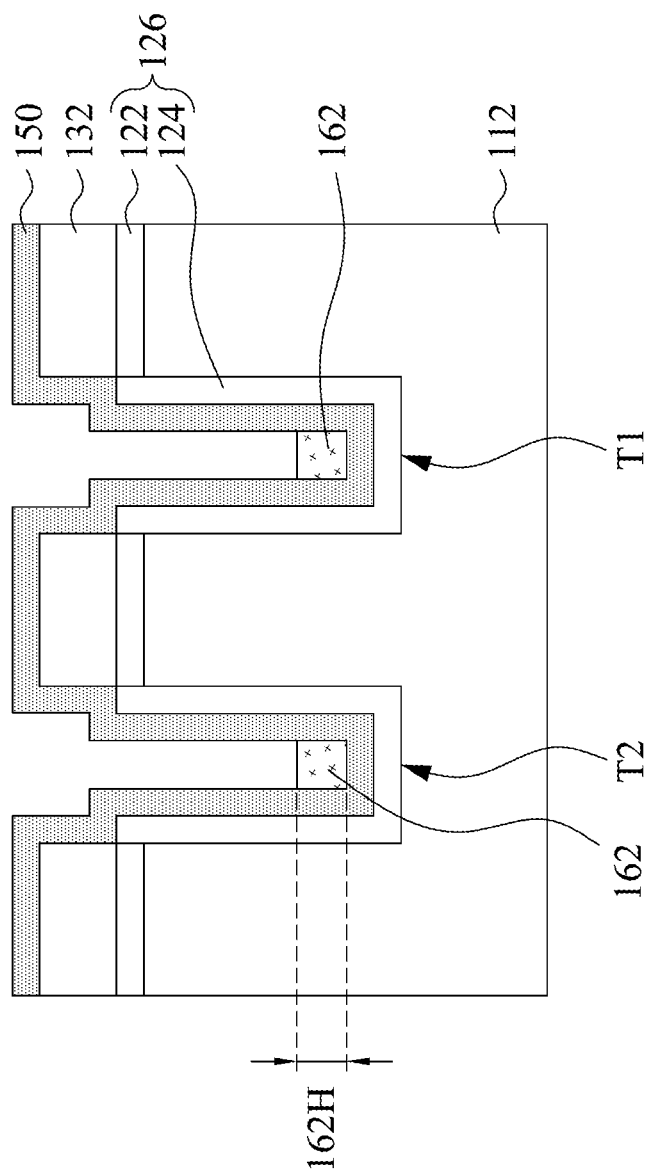

Reference is made to FIG. 1 and FIG. 9. In the operation 16 of FIG. 1, a first gate structure 162 is formed on the first barrier layer 150. FIGS. 8-9 illustrate the detail steps of implementing operation 16 in accordance with an embodiment of the present disclosure.

Referring to FIG. 8, a first gate material 160 is formed on the first barrier layer 150. In some embodiments, the first gate material 160 includes conductive materials such as tungsten (W), aluminum (Al), cupper (Cu), molybdenum (Mo), titanium (Ti), tantalum (Ta), ruthenium (Ru), and/or a combination thereof, but is not limited thereto. The first gate material 160 may be formed on the first barrier layer 150 by suitable deposition method such as CVD, but is not limited thereto. As shown in FIG. 8, the first gate material 160 fills the first trench T1 and the second trench T2 and has a portion over the first barrier layer 150 on the nitride layer 132.

Referring to FIG. 9, the first gate material 160 (shown in FIG. 8) is then recessed to form the first gate structure 162 on the first barrier layer 150 in the bottom of the first trench T1 and the second trench T2. In some embodiments, a dry etching process is performed to form the first gate structure 162. In some embodiments, an etching depth of the first gate material 160 is about 80-100 nm, and the first gate structure 162 has a thickness 162H of about 40-80 nm.

Figure 10:
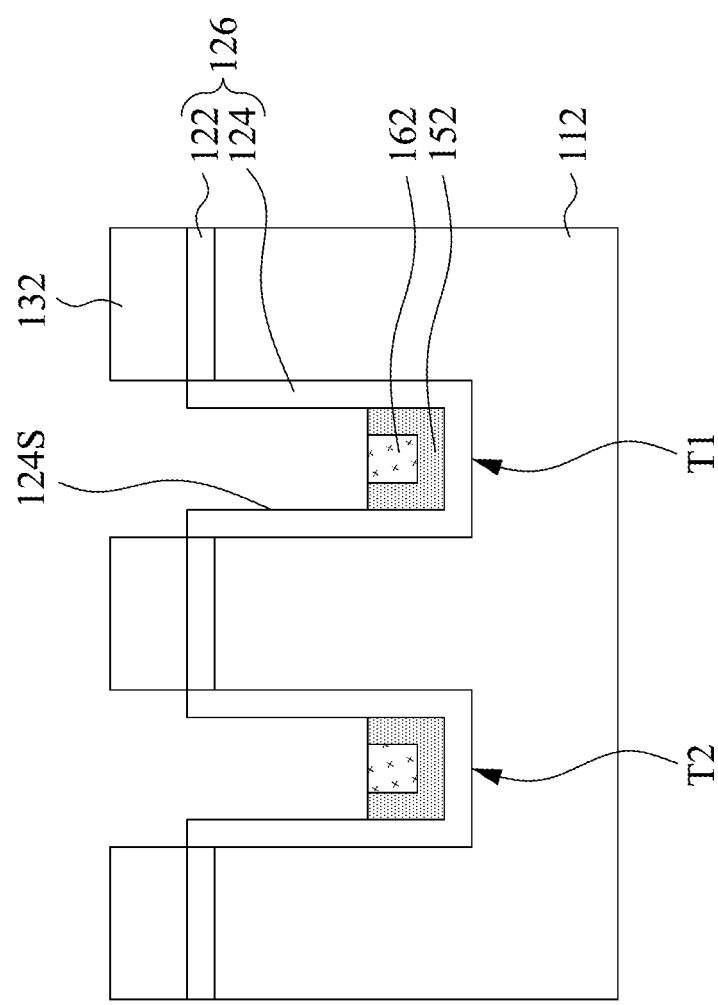

Reference is made to FIG. 1 and FIG. 10. In the operation 18 of FIG. 1, a portion of the first barrier layer 150 (shown in FIG. 9) is removed with an etchant including gas of $CF_4$, $C_2F_6$, $C_3F_8$, $C_4F_8$, $F_2$, $NF_3$, $SF_6$, $CHF_3$, HF, $COF_2$, $ClF_3$ or $H_2O_2$ to expose a sidewall 124s of the oxide layer 124. In some embodiments, the first gate structure 162 is treated with a protectant including gas of $H_2$, $NH_3$, or $C_xH_y$ before removing the portion of the first barrier layer 150, in which x is 1~4 and y is 4-8. In one embodiment, the first barrier layer 150 is titanium nitride, and the first gate structure 162 is tungsten. The reaction between the first gate structure 162 and the protectant may be formulated as follows:

  reaction formula (1)

  reaction formula (2)

  reaction formula (3)

The first barrier layer 150 is etched by the progress of the reactions described in reaction formula (4) and/or reaction formula (5-1)-(5-3) as follows, and the reaction temperature may be 280-300° C. In reaction formula (4), F* represents fluorine radical. In some embodiments, an etching selectivity between the first barrier layer 150 and the first gate structure 162 is of at least about 100:1.

  reaction formula (4)

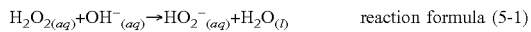  reaction formula (5-1)

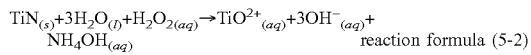  reaction formula (5-2)

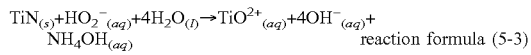  reaction formula (5-3)

After the portion of the first barrier layer 150 is removed, a remaining first barrier layer 152 is formed between the first gate structure 162 and the oxide layer 124. As shown in FIG. 10, a top surface of the remaining first barrier layer 152 is level with a top surface of the first gate structure 162. In other embodiments, the top surface of the remaining first barrier layer 152 is below the top surface of the first gate structure 162. In yet other embodiments, the top surface of the remaining first barrier layer 152 is above the top surface of the first gate structure 162.

The etchant including gas of $CF_4$, $C_2F_6$, $C_3F_8$, $C_4F_8$, $F_2$, $NF_3$, $SF_6$, $CHF_3$, HF, $COF_2$, $ClF_3$ or $H_2O_2$ has high selectivity for the first barrier layer 150 with respect to the oxide layer 126 and the nitride layer 132, such that the first barrier layer 150 may be selectively removed and the layers under the first barrier layer 150 (i.e., the oxide layer 126 and the nitride layer 132) may not be damaged. Therefore, the electric property of the semiconductor device can be improved.

Figure 11:
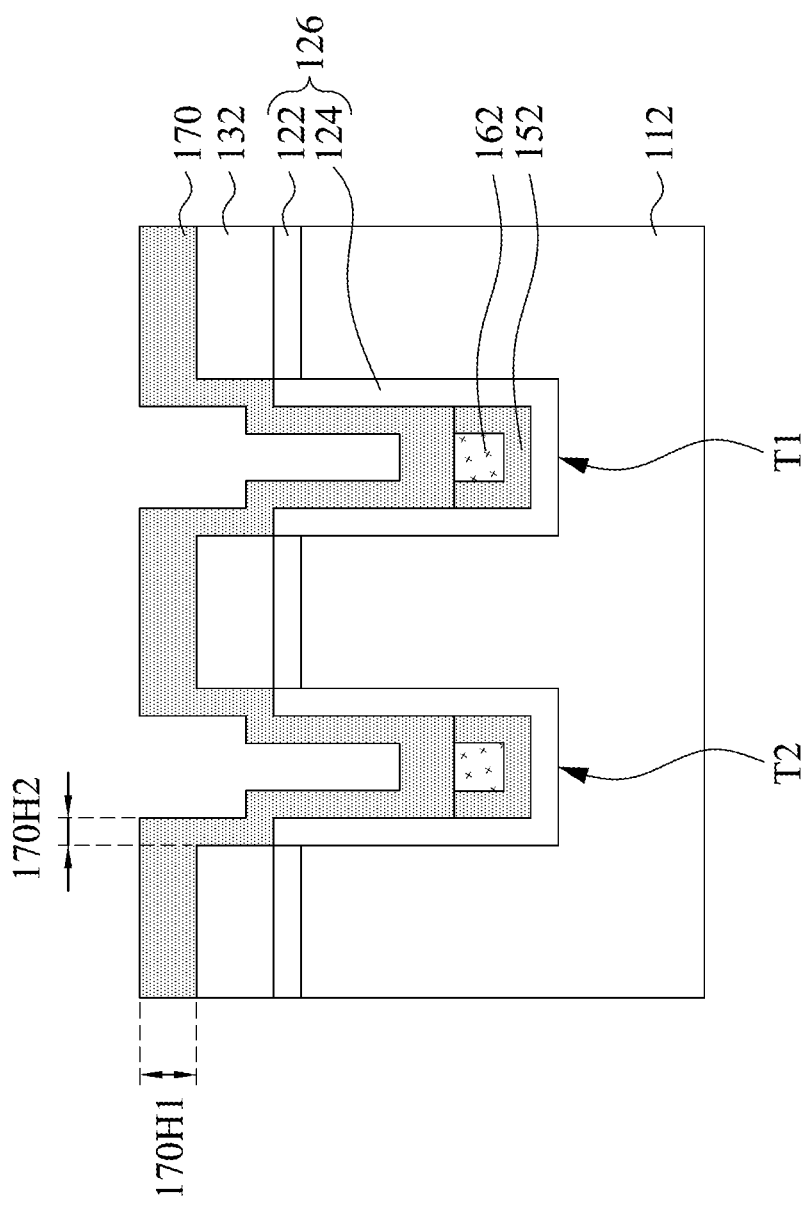

Reference is made to FIG. 1 and FIG. 11. In the operation 20 of FIG. 1, a second barrier layer 170 is formed on the first gate structure 162, the nitride layer 132, and the oxide layer 126. In some embodiments, the second barrier layer 170 includes titanium nitride, but is not limited thereto. In some examples, the material of the second barrier layer 170 is the same as that of the first barrier layer 150. The second barrier layer 170 may be formed on the oxide layer 126, the nitride layer 132, and the first gate structure 162 by suitable deposition method such as PVD. As shown in FIG. 11, a horizontal portion of the second barrier layer 170 (e.g., the second barrier layer 170 on the nitride layer 132) has a thickness 170H1 that is thicker than that 170H2 of a vertical portion of the second barrier layer 170 (e.g., the second barrier layer 170 on the exposed sidewall 124s of the oxide layer 124). In some embodiments, the thickness 170H1 of the second barrier layer 170 is about 10-20 nm, and the thickness 170H2 of the second barrier layer 170 is about 2-8 nm.

Figure 12:
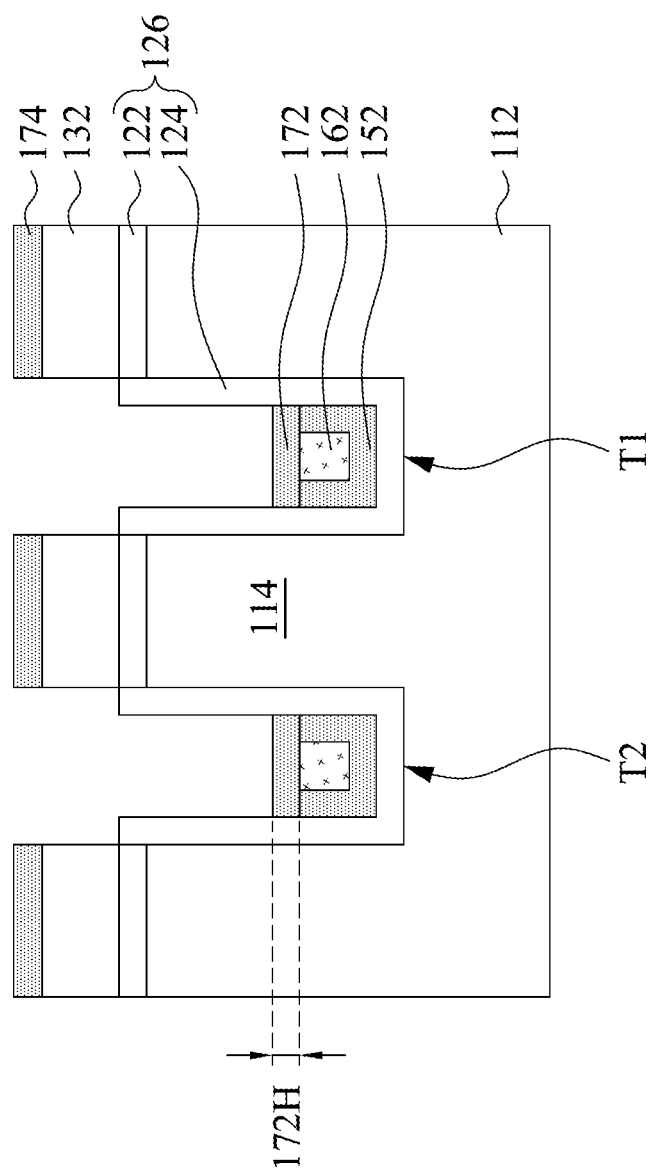

Reference is made to FIG. 1 and FIG. 12. In the operation 22 of FIG. 1, a portion of the second barrier layer 170 (shown in FIG. 11) is removed with the etchant including gas of $CF_4$, $C2F_6$, $C_3F_8$, $C_4F_8$, $F_2$, $NF_3$, $SF_6$, $CHF_3$, HF, $COF_2$, $ClF_3$ or $H_2O_2$. The process of removing the portion of the second barrier layer 170 may be the same as that of removing the first barrier layer 150 described above, and will not be repeated hereinafter. After the portion of the second barrier layer 170 is removed, a portion of the remaining second barrier layer 172 is formed on the first gate structure 162, and another portion of the remaining second barrier layer 174 is formed on the protruding portion 114 of the patterned substrate 112. As shown in FIG. 12, the remaining second barrier layer 172 has a thickness 172H of about 2-4 nm. The remaining first barrier layer 152 and the remaining second barrier layer 172 collectively wrap the first gate structure 162, such that the first gate structure 162 is separated from the oxide layer 126.

Figure 13:
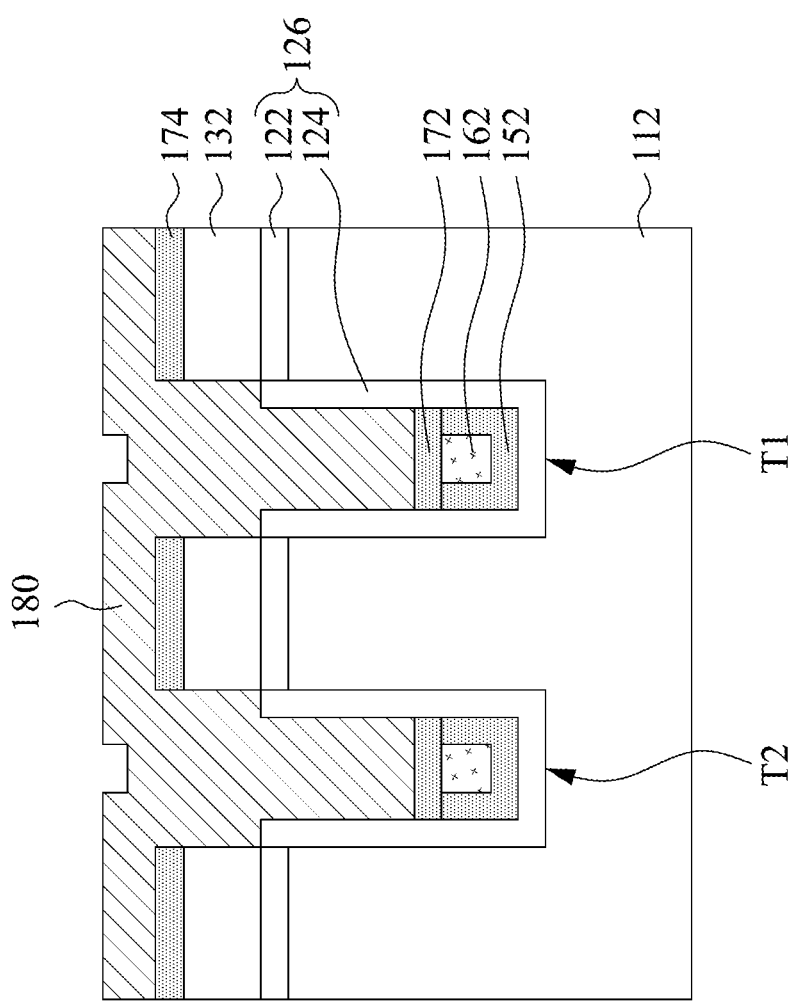
Figure 14:
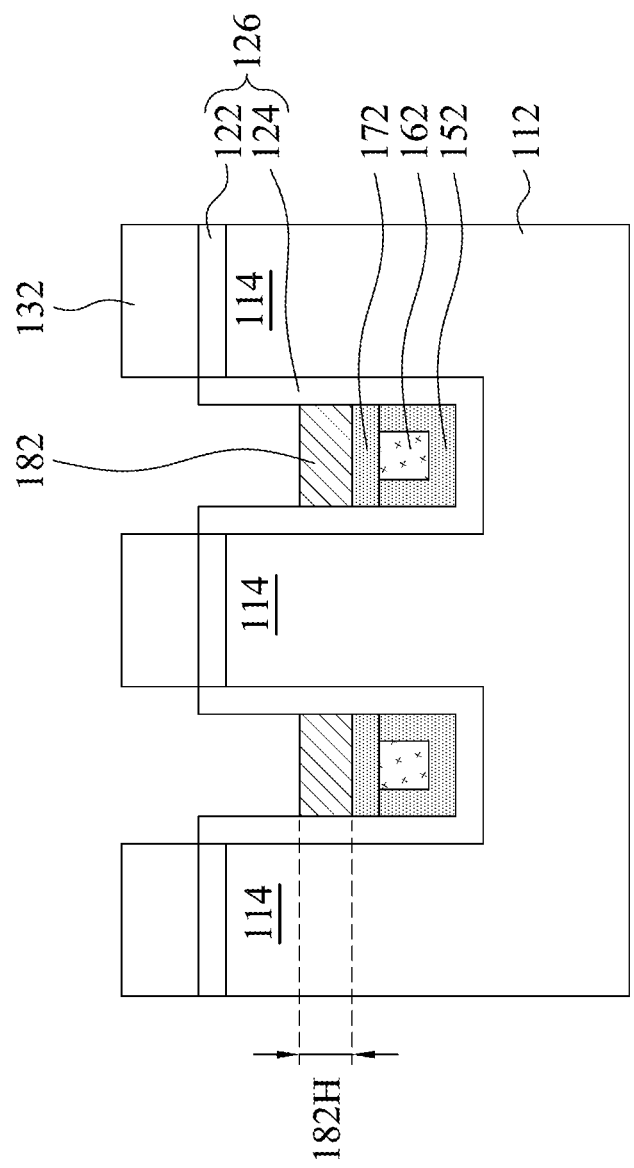

Reference is made to FIG. 1 and FIG. 14. In the operation 24 of FIG. 1, a second gate structure 182 is formed on the remaining second barrier layer 172. FIGS. 13-14 illustrate the detail steps of implementing operation 24 in accordance with an embodiment of the present disclosure.

Referring to FIG. 13, a second gate material 180 is formed on the remaining second barrier layer 172 and oxide layer 126. In some embodiments, the second gate material 180 includes conductive material, such as polysilicon, tungsten (W), aluminum (Al), cupper (Cu), molybdenum (Mo), titanium (Ti), tantalum (Ta), ruthenium (Ru), and/or a combination thereof, but is not limited thereto. In some embodiments, the second gate material 180 may be formed of the same material or a different material from that of the first gate material 160. The second gate material 180 may be formed on the remaining second barrier layer 172 by suitable deposition method. In some embodiments, the second gate material 180 is further in-situ doped with phosphorous. As shown in FIG. 13, the second gate material 180 may be formed covering the remaining second barrier layer 174 to fill the first trench T1 and the second trench T2.

Referring to FIG. 14, the second gate material 180 (shown in FIG. 13) is etched to form the second gate structure 182 in the first trench T1 and the second trench T2. In some embodiments, the remaining portion of the second barrier layer 174 (shown in FIG. 13) on the nitride layer 132 is also removed during etching the second gate material 180. In one embodiment, the second gate material 180 is polysilicon, and the remaining second barrier layer 174 is titanium nitride. The reaction between the second gate material 180 and the etchant including fluorine may be formulated as follows:

  reaction formula (6)

The remaining second barrier layer 174 may be etched by the progress of the reactions described in reaction formula (4) and/or reaction formula (5) as described above, and the reaction temperature may be 280-300° C. In some embodiments, the nitride layer 132 can be protected by gas of $H_2$ during etching the remaining second barrier layer 174. The reaction between the nitride layer 132 and the protectant may be formulated as follows:

$$SiN_{(s)} + H_{(g)} \rightarrow SiNH_{(s)} \qquad \text{reaction formula (7)}$$

As shown in FIG. 14, the first gate structure 162 is separated from the second gate structure 182 by the remaining second barrier layer 172. In some embodiments, the second gate structure 182 has a thickness 182H of about 10-30 nm. The oxide layer 124, the remaining first barrier layer 152, the remaining second barrier layer 172, the first gate structure 162 and the second gate structure 182 may be functioned as a word line structure.

Figure 15:
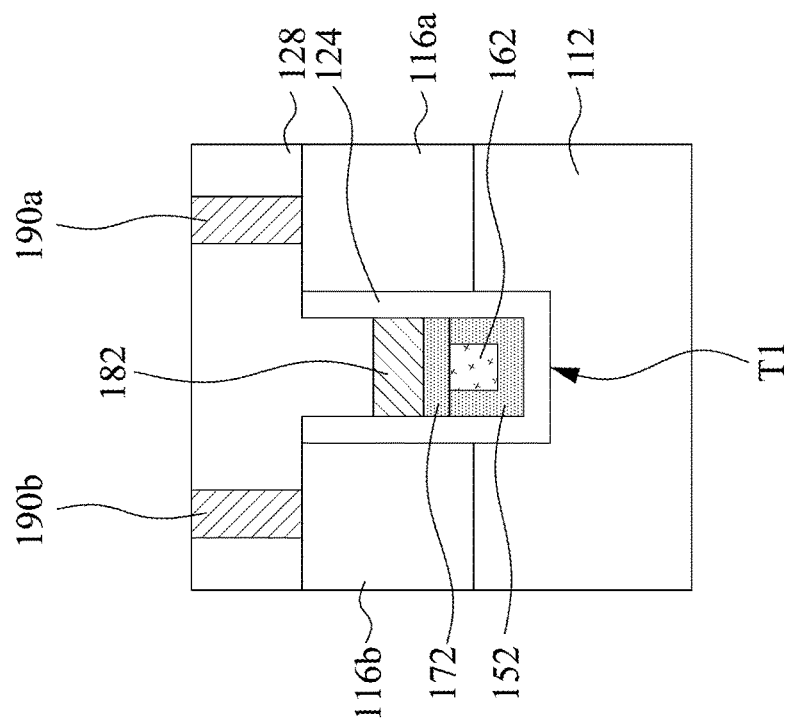

Reference is made to FIG. 15. In some embodiments, the method 10 further includes removing the nitride layer 132 and a portion of the oxide layer 126 that is disposed on the protruding portion 114 (shown in FIG. 14) to exposed a top surface of the patterned substrate 112. The portion of the oxide layer 126 on the inner surface 112s (shown in FIG. 5) of the patterned substrate 112 is still remain after the nitride layer 132 is removed.

In some embodiments, the method 10 further includes forming a first source/drain region 116a and a second source/drain region 116b in the patterned substrate 112. As shown in FIG. 15, the first source/drain region 116a and the second source/drain region 116b are disposed on opposite sides of the first trench T1. That is, the first source/drain region 116a and the second source/drain region 116b are spaced apart from each other by the first trench T1. The first source/drain region 116a and the second source/drain region 116b may be formed by implanting impurity ions into the patterned substrate 112 at both sides of the first trench T1. Similarly, a third source/drain region (not shown) may be formed in the patterned substrate 112. The third source/drain region and the first source/drain region 116a may be disposed on opposite sides of the second trench T2.

Reference is still made to FIG. 15. In some embodiments, the method 10 further includes forming a first contact 190a and a second contact 190b respectively connected to the first source/drain region 116a and the second source/drain region 116b. In some embodiments, a third contact (not shown) may be further formed on and connected to the third source/drain region. In one embodiment, the first source/drain region 116a is a drain region, the second source/drain region 116b is a source region, and the first contact 190a and the second contact 190b are respectively connected to a bit line and a capacitor.

In some embodiments, the method 10 further includes forming a dielectric layer 128 on the second gate structure 182 and covering the patterned substrate 112. The dielectric layer 128 may include silicon oxide, silicon nitride, or the like. As shown in FIG. 15, a semiconductor device 200 is formed. In some embodiments, the semiconductor device 200 may be an array transistor, such as a buried-channel array transistor (BCAT).

As described above, according to the embodiments of the present disclosure, a method of manufacturing a semiconductor device is provided. In the manufacturing of the semiconductor device of the present disclosure, a first barrier layer and a second barrier layer are removed with an etchant including $CF_4$, $C_2F_6$, $C_3F_8$, $C_4F_8$, $F_2$, $NF_3$, $SF_6$, $CHF_3$, HF, $COF_2$, $ClF_3$ or $H_2O_2$. The etchant including $CF_4$, $C_2F_6$, $C_3F_8$, $C_4F_8$, $F_2$, $NF_3$, $SF_6$, $CHF_3$, HF, $COF_2$, $ClF_3$ or $H_2O_2$ has high selectivity for the first barrier layer and the second barrier layer, which prevents the damage of the layers under the barrier layers (e.g., a dielectric layer) during removing the first barrier layer and the second barrier layer. Therefore, the electric property of the semiconductor device can be improved.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of manufacturing a semiconductor device, comprising:
    forming a precursor structure, wherein the precursor structure comprises:
        a patterned substrate having at least one trench therein;
        an oxide layer covering the patterned substrate; and
        a nitride layer on the oxide layer and exposing a portion of the oxide layer in the trench;
    forming a first barrier layer on the oxide layer;
    forming a first gate structure on the first barrier layer;
    removing a portion of the first barrier layer with an etchant including $CF_4$, $C_2F_6$, $C_3F_8$, $C_4F_8$, $F_2$, $NF_3$, $SF_6$, $CHF_3$, HF, $COF_2$, $ClF_3$ or $H_2O_2$ to expose a sidewall of the oxide layer;
    forming a second barrier layer on the first gate structure and the oxide layer;
    removing a portion of the second barrier layer with the etchant including $CF_4$, $C_2F_6$, $C_3F_8$, $C_4F_8$, $F_2$, $NF_3$, $SF_6$, $CHF_3$, HF, $COF_2$, $ClF_3$ or $H_2O_2$, wherein after removing the portion of the second barrier layer, the second barrier layer remaining on the first gate structure has a thickness of about 2-4 nm; and
    forming a second gate structure on the second barrier layer.

2. The method of claim 1, wherein forming the precursor structure comprises:
    forming an oxide material layer on a top surface of a substrate;
    forming a nitride material layer on the oxide material layer;
    forming a mask layer on the nitride material layer, wherein the mask layer has at least one opening exposing a portion of the nitride material layer;
    etching the nitride material layer, the oxide material layer and the substrate through the mask layer to form the patterned substrate; and
    forming the oxide layer to cover the trench.

3. The method of claim 1, wherein the first gate structure is treated with a protectant comprising $H_2$, $NH_3$, $C_xH_y$ and a combination thereof before removing the portion of the first barrier layer, wherein x is 1-4 and y is 4-8.

4. The method of claim 1, wherein the first barrier layer and the second barrier layer collectively wrap the first gate structure.

5. The method of claim 1, wherein forming the second gate structure further comprising:
    forming a second gate material on the second barrier layer;
    doping the second gate material with phosphorous; and
    etching the second gate material to form the second gate structure in the trench.

6. The method of claim 1, wherein the first barrier layer and the second barrier layer comprises titanium nitride.

7. The method of claim 1, further comprising implanting ions into the patterned substrate at both sides of the trench to form a first source/drain region and a second source/drain region in the patterned substrate.

8. The method of claim 7, further comprising forming a first contact and a second contact respectively connected to the first source/drain region and the second source/drain region.

9. A method of manufacturing a semiconductor device, comprising:
- forming a precursor structure, wherein the precursor structure comprises:
  - a patterned substrate having at least one trench therein;
  - an oxide layer covering the patterned substrate; and
  - a nitride layer on the oxide layer and exposing a portion of the oxide layer in the trench;
- forming a first barrier layer on the oxide layer;
- forming a first gate structure on the first barrier layer;
- removing a portion of the first barrier layer with an etchant including $CF_4$, $C_2F_6$, $C_3F_8$, $C_4F_8$, $F_2$, $NF_3$, $SF_6$, $CHF_3$, $HF$, $COF_2$, $ClF_3$ or $H_2O_2$ to expose a sidewall of the oxide layer;
- forming a second barrier layer on the first gate structure and the oxide layer;
- removing a portion of the second barrier layer with the etchant including $CF_4$, $C_2F_6$, $C_3F_8$, $C_4F_8$, $F_2$, $NF_3$, $SF_6$, $CHF_3$, $HF$, $COF_2$, $ClF_3$ or $H_2O_2$; and
- forming a second gate structure on the second barrier layer, wherein the second gate structure has a thickness of about 10-30 nm.

* * * * *